United States Patent [19]

Kwon et al.

[11] Patent Number: 4,495,478
[45] Date of Patent: Jan. 22, 1985

[54] CAVITY RESONATOR FOR ATOMIC FREQUENCY STANDARD

[75] Inventors: Tae M. Kwon, Thousand Oaks; Howard E. Williams, Northridge, both of Calif.

[73] Assignee: Litton Systems, Inc., Beverly Hills, Calif.

[21] Appl. No.: 467,061

[22] Filed: Feb. 16, 1983

[51] Int. Cl.³ .......................... H01P 7/06; H01S 1/06; H03L 7/26
[52] U.S. Cl. .................................... 333/230; 324/305; 331/3; 331/94.1
[58] Field of Search .................... 331/3, 94.1; 250/251; 324/304, 305, 313; 333/227, 228, 230

[56] References Cited

U.S. PATENT DOCUMENTS 3,798,565  3/1974  Jechart .............................. 331/94.1
4,349,798  9/1982  Podell et al. ...................... 331/3 X Primary Examiner—Siegfried H. Grimm
Attorney, Agent, or Firm—Elliott N. Kramsky

[57] ABSTRACT

An improved microwave cavity resonator for use in vapor-cell atomic frequency standards. The resonator comprises a generally-rectangular hollow metallic body designed to support the $TE_{101}$ mode of standing wave. A dielectric element is positioned within the cavity to concentrate electro-magnetic field so that a compact design is achieved and so that a preselected, substantially uniform magnetic field will be coupled into an alkali metal vapor absorption cell within the resonator. Means are provided for mounting elements of an excitation circuit to preferentially excite the desired $TE_{101}$ mode.

11 Claims, 6 Drawing Figures

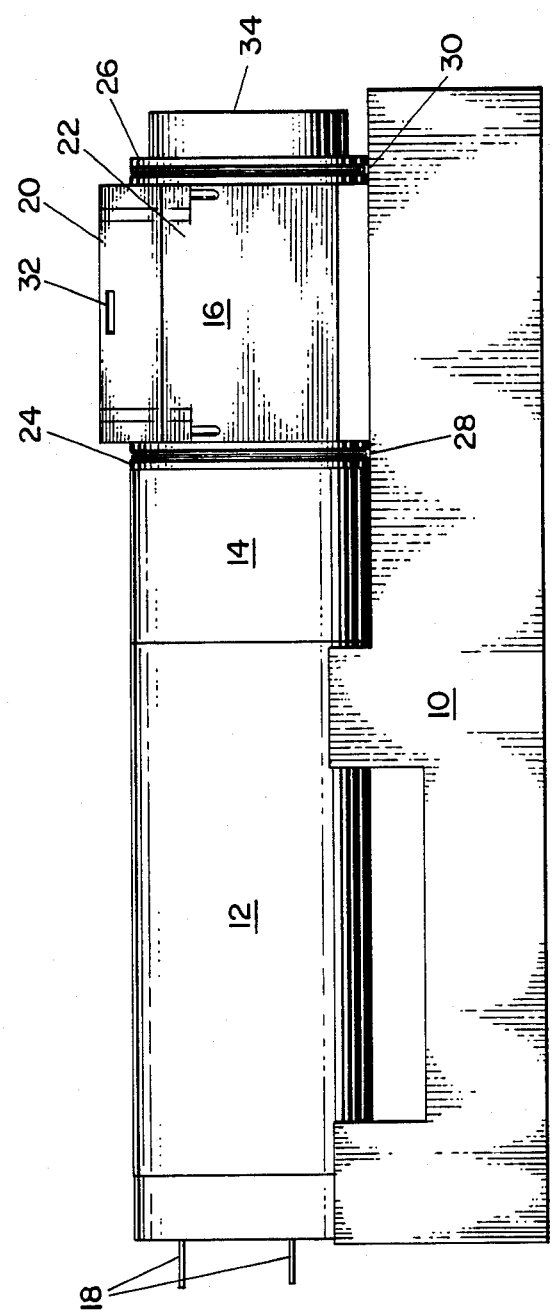

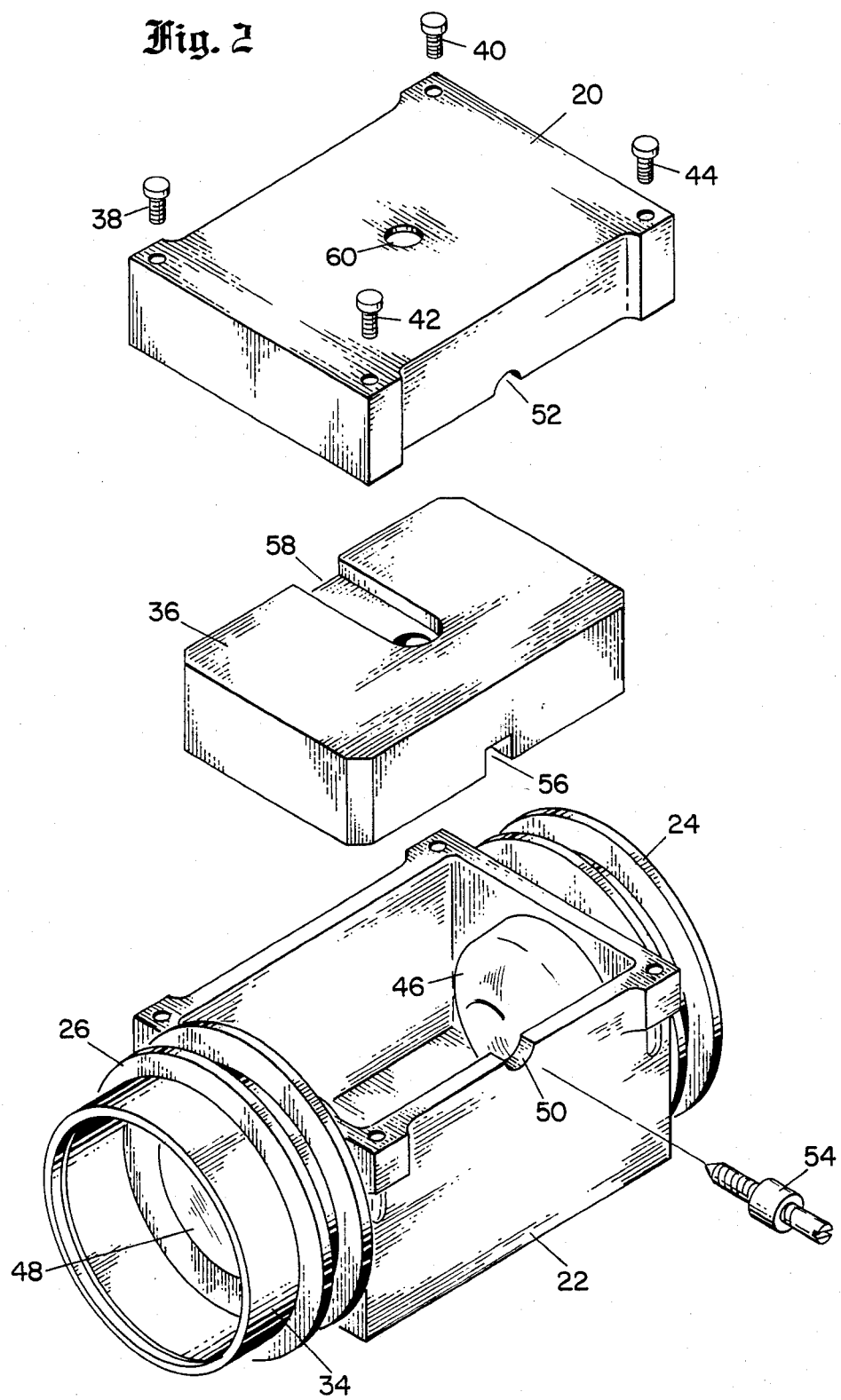

CAVITY RESONATOR FOR ATOMIC FREQUENCY STANDARD

BACKGROUND OF THE INVENTION

1. Field of the Invention

The present invention relates to improvements in vapor-cell atomic frequency standards. More particularly, this invention pertains to an improved microwave cavity resonator for use in such systems.

2. Description of the Prior Art

Atomic frequency standard systems are commonly utilized to regulate the frequency of quartz crystal oscillators that otherwise lack frequency stability. Essentially, such systems attempt to lock the frequency of the quartz crystal oscillator onto the natural frequency of oscillation of an element such as an alkali metal. The frequency associated with the element corresponds to the difference in energy between the two hyperfine structure levels of the ground state of the atom which, for the isotope $^{87}$Rb, lies at about 6.83 GHz.

The mechanism for regulating the quartz oscillator is an atomic resonance system, which generally includes a gas discharge lamp filled with the desired alkali metal vapor (e.g. rubidium) that is optically aligned with a cell consisting of an evacuated glass bulb filled with the vaporized alkali metal and with a photosensitive light receiver positioned to detect light emanating from the lamp after passage through the cell. Such a system is disclosed, for example, in U.S. Pat. No. 3,798,565 of Jechart for "Gas Cell Atomic Frequency Standard of Compact Design".

In accordance with such a system, the light spectrum of the selected element radiated from the lamp (which, incidentally, is actuated to discharge by r.f. energy) is absorbed by the rubidium in the absorption cell in a process known as resonance absorption or "optical pumping" in which the equilibrium populations of the two hyperfine ground states are preferentially altered. This process reduces the light absorption capacity of the vapor within the cell so that, after a period of time, an increase in the intensity of the light striking the photodetector after passage through the cell may be detected.

In an atomic frequency standard, a type of closed-loop control system, the effect of the optical pumping process upon the light absorption properties of the element within the cell are counteracted and the "error signal" resulting therefrom driven to zero by the injection of electromagnetic energy of frequency equal to that of the atomic resonance of the element within the absorption cell. A microwave cavity is commonly provided in an atomic frequency standard system for coupling the injected electromagnetic energy to the atoms of the vapor within the cell. The microwave cavity (resonator) is designed for resonance at the atomic frequency of the element to assure efficient injection of the electromagnetic energy, which energy is derived by frequency multiplication of the output of the monitored quartz oscillator. When the derived frequency of the injected electromagnetic energy is precisely equal to the atomic frequency of the element, the effect of the optical pumping process is reversed, and the light absorption of the element within the cell increased significantly, an effect that is detected by the photosensitive element. A feedback system, coupled to the resonator and to the photodetector, then utilizes the detected change in the absorption property to monitor and drive the frequency of the quartz crystal oscillator to and maintain it at its preselected nominal value.

The effective functioning of an atomic frequency standard in accordance with the general configuration and mode of operation as above described makes numerous demands upon the system's microwave cavity resonator. As mentioned, it must be accurately tuned to the resonant frequency of the alkali metal for efficient injection of electromagnetic energy of the desired frequency therein. Additionally, it should preferably enhance the interaction of the injected electromagnetic energy with the cell and its contents. In the past, cylindrical cavity resonators have been designed to support the TE$_{011}$ and TE$_{111}$ modes. The former designs (TE$_{011}$) generally provide efficient coupling to the absorption cell. However, the designs of cavities have been unacceptably large for use in airborne or satellite environments. For example, TE$_{011}$ mode cylindrical cavities have required, at a minimum, a diameter of approximately 2.5 inches and length of approximately one inch to function effectively. The TE$_{111}$ mode cavity can be designed for lesser size; a cavity of about one inch diameter and length will support this mode. However, due to the nature of the TE$_{111}$ standing wave, the electromagnetic energy injected into the cavity is not coupled efficiently into the internal absorption cell as the magnetic flux of the injected energy is concentrated about the edges of the cavity.

SUMMARY OF THE INVENTION

The foregoing and additional problems of the prior art are addressed and solved by the present invention which provides a rectangular cavity resonator for a vapor-cell atomic frequency standard. The resonator comprises a substantially rectangular body having an internal cavity for supporting TE$_{011}$ mode electromagnetic energy. Means are provided for preferentially orienting said TE$_{101}$ mode electromagnetic energy.

A further aspect of the invention comprises a TE$_{101}$ mode cavity resonator. The resonator includes a body comprising a cap and a lower body having a substantially rectangular internal cavity. The body has a pair of apertures at opposed ends for mounting optical lenses. A substantially planar dielectric element is provided within the cap. Means are provided for preferentially ordering electromagnetic energy within the cavity.

The foregoing and additional features of the present invention will become apparent from the detailed description which follows. In this description, there are utilized numerals that refer to numerals of the drawing figures, like numerals referring to like features throughout the drawings and the description.

BRIEF DESCRIPTION OF THE DRAWINGS

FIG. 1 is a side view of an atomic resonance system (commonly referred as "physics package") incorporating the present invention;

FIG. 2 is an exploded perspective view of a microwave cavity resonator in accordance with the present invention;

DETAILED DESCRIPTION

Figure 3A:
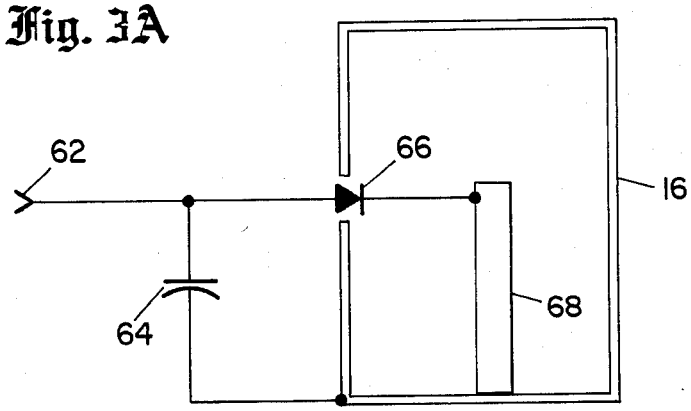
FIGS. 3A and 3B are an electrical schematic and a partial cross section of the cap of the cavity resonator for the purpose of illustrating means for mounting energy injection circuitry in cooperation with the present invention.

Turning now to the drawings, FIG. 1 is a side view of an atomic resonance system incorporating apparatus according to the present invention. The system, which is mounted upon an alignment base 10, includes an R.F. discharge lamp 12, filter cell 14 and resonant cavity 16. Conductors 18 supply r.f. energy to a coil that surrounds and excites an electrodeless bulb within the the lamp 12 that contains an alkali metal vapor. Means are provided for regulating the temperature and pressure of the vapor within the bulb. In the event that $^{87}$Rb is employed, its D1 and D2 spectral lines comprise the spectrum of emitted light.

The light passes from the lamp 12 and travels as a beam through the filter cell 14 in which one of the two ground states of the $^{87}$Rb isotope is diminished by injection of the isotope $^{85}$Rb. In diminishing one of the ground states, the rubidium light is enabled to optically pump the rubidium contained in a conventional absorption cell within the cavity resonator 16.

The resonator 16 comprises a generally rectangular geometry of two major hollowed metallic elements, a removable cap 20 and a lower body 22. Circular paired flanges 24 and 26 are formed with and located at opposed ends of the resonator 16. The paired flanges 24 and 26 form spools for wire windings 28 and 30 respectively. Currents supplied to the windings 28 and 30 cause a constant magnetic field known as a "C field" to be set up within the resonantor 16. This field effects the "fine tuning" of the rubidium absorber cell within, assuring an accurate, in addition to a stable, atomic frequency standard. A slot 32 in a side wall of the resonator 16 sits at the beginning of a horizontal passageway within the cap 20 for insertion of a length of conductor that forms a radiating element or circuit loop of an energy injection circuit which is driven by the regulated oscillator. As will be seen more clearly in FIG. 3B, the orientation of this element, which is made possible by the particular arrangement of the elements of the resonator 16, assures that the TE$_{101}$ field within the cavity 16 is preferentially excited. A cylindrical housing 34 that forms a portion of the resonator 16 is adapted to receive a photodetector (not shown). Any of a number of such devices, having an output that is responsive to the intensity of light incident upon a surface, is suitable in the vapor-cell atomic frequency standard of FIG. 1. An actual embodiment of such a system employs a "General Purpose Detector" silicon photodetector of the type commercially available from the Silicon Detector Corporation of Newbury Park, California.

FIG. 2 is an enlarged exploded perspective view of the microwave resonant cavity 16 of the invention. The view shown in this figure is taken from the side opposite that shown in FIG. 1 to facilitate the complete illustration of the present invention. As can be seen, the resonator 16 generally comprises an assembly of three elements: the removable cap 20, the lower body 22 and a substantially planar element of dielectric material 36. When assembled, the element 36 is fitted within the cap 20, its top surface being substantially flush with the top of the hollow cap 20. Screws 38, 40, 42 and 44, in conjunction with matching corner fittings of the cap 20 and lower body 22, secure the unit. The bifurcated construction of the cavity allows, with minimum disturbances in the desired mode of standing wave within the cavity, simplified and reusable insertion of an absorption cell within the lower body 22 prior to use and easy access to the interior of the cavity 16 for purposes of maintenance and/or repair.

As is seen in FIG. 2, the lower body 22 comprises a compact unitary design with the circular flanges 24 and 26 formed at opposed ends of the interior chamber of the metal, preferably brass, lower body 22. The cylindrical housing 34 for mounting an appropriate photodetector is shown to be concentric with the circular flanges 24 and 26 which, as mentioned above, act as spools for fine wire conductors.

Openings are provided in the opposed end walls of the lower body 22 for mounting focusing lenses 46 and 48. In a fully assembled atomic resonance system, the lens 46 is positioned between the filter cell 14 and the absorption cell (not shown) within the hollow lower body 22, serving to focus the filtered rubidium spectral beam into the absorption cell while the lens 48, located between the cell and the photodetector (not shown) mounted within the housing 34, acts to concentrate the light onto the photosensitive silicon surface of the photodetector.

A semi-circular notch 50 is located in an upper edge of a side wall of the lower body 22. The semi-circular notch 50 matches a semi-circular notch 52 in the mating lower edge of a side wall of the removable cap 20 so that, when assembled, there is formed a circular orifice for insertion of a tuning screw 54 into the resonator. A slot 56 in the bottom of the dielectric element 36, that extends throughout its width, allows insertion of the tuning screw 54 to the appropriate depth for fine tuning the resonator 16 to correct the inaccuracies that result from manufacturing tolerances and the like.

Turning again to the dielectric element 36, it is seen that a second slot 58 is formed in its top surface. The slot 58, like the slot 56, is oriented parallel to the end walls of the lower body 22. As will be seen in FIG. 3B, this orientation is a critical feature of the resonator 16 that allows insertion of a length of a radiative circuit element having a preferred orientation into the slot 32 (shown in FIG. 1) in the side of the cap 20. The orientation of such radiative element acts to align the standing wave within the interior cavity of the resonator 16 to the direction shown in FIG. 4 so that the substantially uniform magnetic field found within the cavity is coupled optimally into the absorption cell.

The slot 58 terminates in the approximate center of the top face of the dielectric element 36. The termination of the slot 58 is semi-circular and aligned with a hole 60 in the top of the cap 20. The hole 60 will be seen in FIG. 3B to accomodate the step recovery diode of the circuit for injecting electromagnetic energy into the cavity resonator 16.

FIG. 3A is an electrical schematic of a conventional circuit for injecting electromagnetic energy into a cavity such as the resonator 16. The circuit accepts an output of approximately 120 Megahertz that is derived from the output of the monitored quartz crystal oscillator by a means of a conventional arrangement of frequency multiplication stages. This signal is applied at an input port 62 to the circuit which includes a decoupling capacitor 64, a step recovery diode 66, a length of radiative conductor 68 and the top wall of the cap of the cavity resonator 16. As is well known, the diode 66 functions as a harmonic generator producing an output signal that contains multiple harmonics of the input signal, the fifty-seventh harmonic of the input 120 Megahertz frequency being 6.83 GHz, the atomic frequency of rubidium. As the resonator 16 is designed and fine tuned to this very same frequency, all of the signal input into the resonator 16 is substantially 6.83 GHz in frequency. As discussed above, the injected electromagnetic energy at this frequency interacts with the rubidium absorption cell to produce a detectable reversal of the optical pumping process.

Figure 3B:
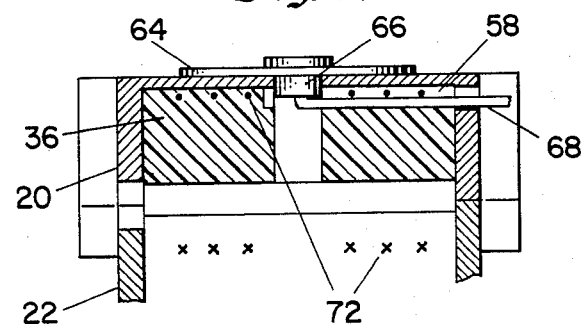

FIG. 3B is a transverse cross-section of a portion of the resonator 16 taken through the hole 60. This view includes a portion of the injection circuitry shown schematically in FIG. 3A and not otherwise shown in the other views herein. The physical elements shown in FIG. 3B are numbered in accordance with the numbering of these elements (as shown schematically) in FIG. 3A. In addition, lines of magnetic flux resulting from the field surrounding the radiative conductor 68 are shown at 72. As is seen, the magnetic field is substantially parallel to the length of the resonator 16. This arrangement of the $TE_{101}$ field is a direct result of the orientation of the upper slot 58 transverse to the length of the resonator 16. Such orientation of the slot 58 allows the current loop of conductor 68 to be properly arranged so that, by application of the well-known righthand rule to the flow of current along the length of the radiative element 68, the H field orientation of FIG. 3B (and FIG. 4) is achieved.

Figure 4:
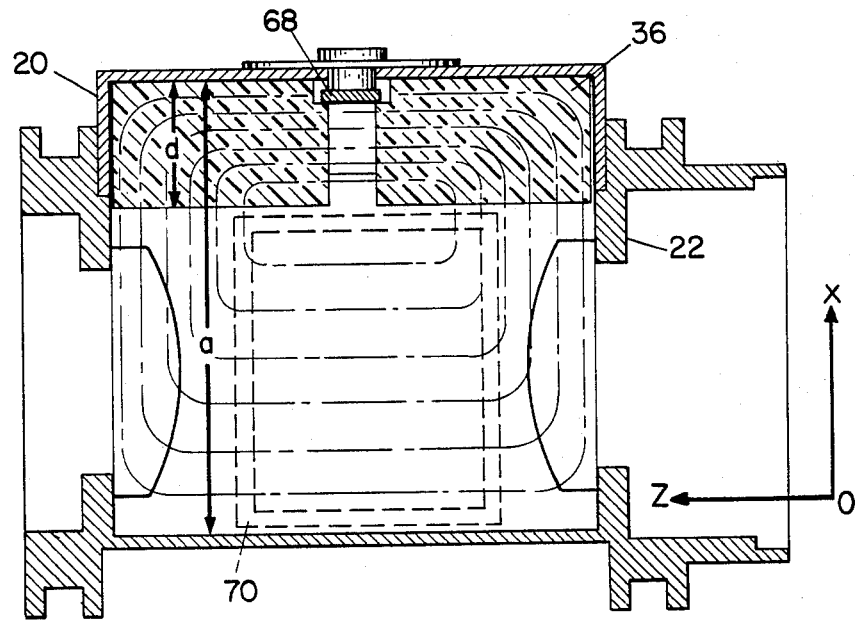
FIG. 4 is a cross section of the cavity resonator for the purpose of illustrating the lines of magnetic flux produced therein.

FIG. 4 is a longitudinal cross-section of the resonator 16 taken orthogonal to the section shown in FIG. 3B through the hole 60. Absorption cell 70, shown positioned within the resonator 16 is seen to encounter a plurality of magnetic field lines parallel to its length representing lines of $TE_{101}$ mode magnetic flux. As mentioned above, the orientation of the radiative conductor 68 aligns the $TE_{101}$ standing wave within the cavity so that the magnetic field is ordered in a direction substantially parallel to the length of the resonator 16. As a result, a substantially uniform magnetic flux is presented throughout the length of the rubidium cell 70. As is well known, such a uniform flux concentrated within the area occupied by the cell 70 produces highly effective coupling of the magnetic field with the rubidium atoms. As a result, the light absorption of the rubidium within the cell 70 is quite sensitive to and significantly increased when the frequency of the injected electromagnetic energy is equal to the frequency of atomic resonance. Thus, in an atomic frequency standard employing a resonator according to the invention an extremely accurate indication of the frequency of the injected energy that is directly related to the frequency of the monitored oscillator, is obtained through analysis of the light intensity incident upon the photodetector after passage through the absorption cell.

As is further noted from this figure, the dielectric element 36 concentrates the magnetic field within the resonator 16, increasing the uniformity of the free space portion of the field (i.e. that within the lower body 22) and allowing further compactness of cavity design. As mentioned above, whereas prior art cavities have been unable to achieve both uniformity of field distribution and compactness, a rectangular $TE_{101}$ mode cavity in accordance with the present invention will achieve the uniform distribution of magnetic flux shown in FIG. 4 with a relatively compact design. A rectangular $TE_{101}$ mode cavity for an atomic frequency standard system has been constructed in accordance with the present invention with dimensions of $0.5 \times 0.7 \times 0.8$ inches, a substantial decrease in size over the present-day technology discussed above.

The distances "a" and "d", corresponding to the height of the cavity within the resonator 16 and to the thickness of the dielectric element 36 respectively, are noted in FIG. 4. Also noted in this figure, for purposes of subsequent analysis, are the x and z coordinates of a three-dimensional system (the third, or y coordinate axis, lies in a plane perpendicular to the paper).

As is well known, a TE electromagnetic wave traveling through two distinct transmission media, "1" and "2", along the indicated z axis may be defined by the following equations:

$$E_z = 0$$

$$E_x = 0$$

$$H_y = 0$$

$$H_{z1} = \cos K_1 x$$

$$H_{z2} = A \cos(k_2 x + \phi)$$

$$(\text{at } x = a \ k_2 a + \phi = \pi)$$

$$\phi = \pi - k_2 a$$

$$H_{z2} = A \cos(k_2(x - a) + \pi)$$

$$= -A \cos k_2(x - a)$$

$$H_{x1} = \frac{\gamma}{k_1} \sin k_1 x$$

$$H_{x2} = -A \frac{\gamma}{k_2} \sin k_2(x - a)$$

$$E_{y1} = \frac{-j\omega\mu}{k_1} \sin k_1 x$$

$$E_{y2} = \frac{j\omega\mu}{k_2} \sin k_2(x - a)$$

where:

$k_1, k_2$ = phase coefficients $\gamma$ = propagation constant $\mu$ = permeability At the boundary of materials media 1 (free space) and 2 (dielectric element), $H_z$ and $E_y$ are continuous (i.e. $H_{z1} = H_{z2}$, $E_{y1} = E_{y2}$) leading to the equality:

$$\frac{\tan k_1(a - d)}{k_1} = -\frac{\tan k_2 d}{k_2}$$

Figure 5:
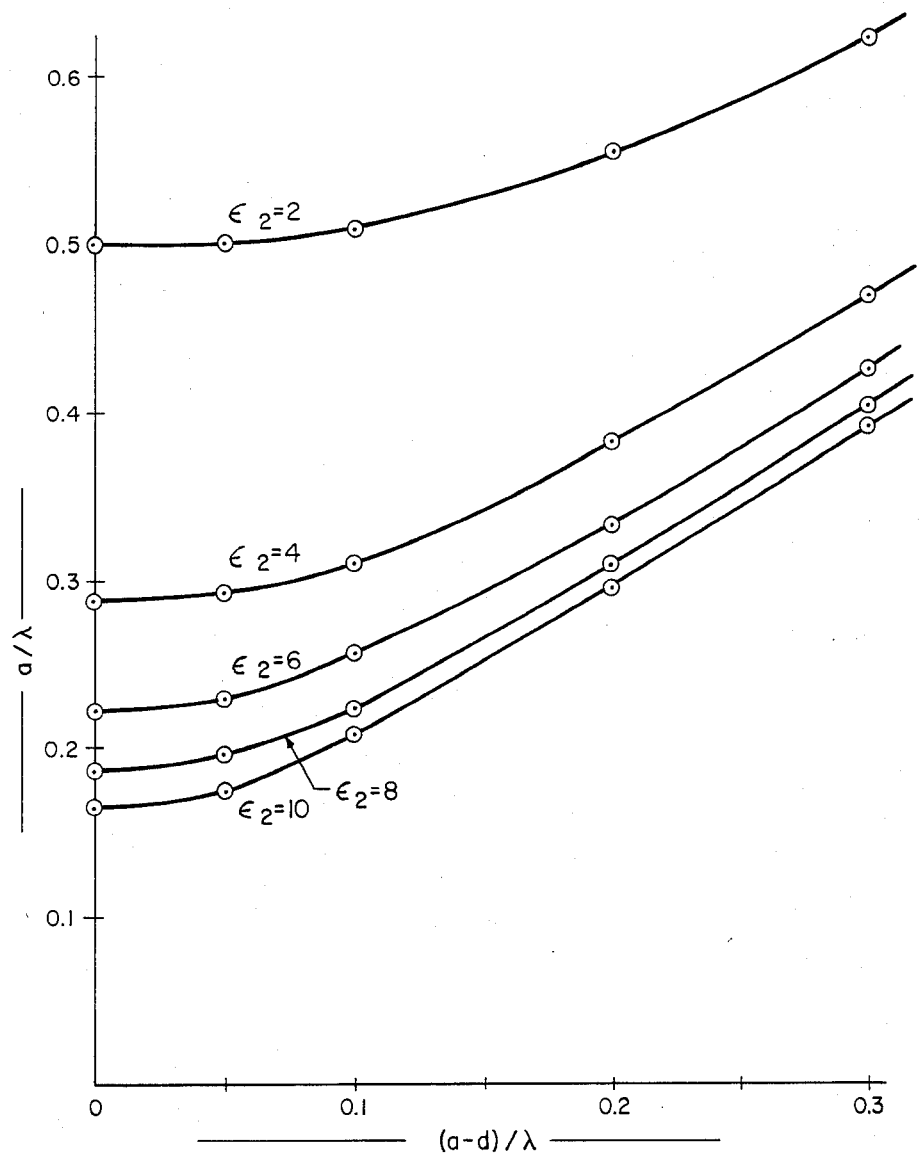
FIG. 5 is a graph illustrating design parameters for a cavity resonator in accordance with the present invention.

For $TE_{10}$ mode electromagnetic energy traveling in a waveguide, $\gamma = j(2\pi/\lambda g)$ where $\lambda_g$ is the guide wavelength. A constant value for the free space magnetic field $H_{z1}$ is obtained by setting $k_1$ to zero. It can be shown that this condition is obtained when the wavelength $\lambda$ of the energy traveling through the guide approaches $\lambda_g$. When $\lambda$ approaches $\lambda_g$, $k_2$ approaches $2\pi/\lambda$ where $\epsilon_2$ is the value of the relative dielectric constant of the element 36. Solving for the boundary conditions now, in terms of the distances indicated in FIG. 4, yields the equation $\tan k_2 d = -k_2(a - d)$. The preceding equation can be solved for given values of $\lambda$, $\epsilon_2$, a and d as shown by the plotted graph of FIG. 5. In this figure, values of the ratio $a/\lambda$ are plotted on the ordinate and values of the ratio $(a-d)/\lambda$ are plotted on the abscissa. Each curve is plotted for a given value of the relative dielectric constant $\epsilon_2$. Thus, for a given $\lambda$ and dielectric element, the appropriate dimensions for the cavity of a resonator 16 in accordance with the invention and having the advantages of the invention with regard to optimal coupling of energy to the vapor cell may be determined from the results of the preceding analysis.

An additional critical factor in the design of a resonator 16 in accordance with the invention concerns the location of the horizontal "break line" between the metallic cap 20 and the lower cavity 22. While the device may function with a suboptimally-located break between the cap 20 and the lower cavity 22, optimum function is obtained when there exists no component of surface current that is perpendicular to the break line. In accordance with the preceding analysis, such location exists at the value of x that maximizes the value of $E_{y2}$ as expressed in the preceding equation therefor.

Thus it is seen that there has been brought to the microwave arts a new and improved resonator for use in a vapor cell atomic frequency standard. While the invention has been described in a preferred embodiment, it must be kept in mind that all other embodiments falling within the language of the claims that follow are intended to be included within its scope.

What is claimed is:

1. A cavity resonator for a vapor cell atomic frequency standard comprising, in combination:
   (a) a substantially rectangular body having an internal cavity for supporting $TE_{101}$ mode electromagnetic energy; and
   (b) means for preferentially orienting said $TE_{101}$ mode electromagnetic energy.

2. A cavity resonator as defined in claim 1 further characterized in that said internal cavity includes a substantially planar element of dielectric material.

3. A cavity resonator as defined in claim 2 wherein said rectangular body further comprises:
   (a) a cap; and
   (b) a lower body.

4. A cavity resonator as defined in claim 3 wherein said dielectric element is located substantially within said cap.

5. A cavity resonator as defined in claim 4 wherein said means for preferentially orienting said $TE_{101}$ mode electromagnetic energy is further characterized in that said dielectric element includes a slot arranged to preferentially mount a radiative element within said cavity.

6. A cavity resonator as defined in claim 5 wherein said slot is adapted to receive a length of waveguide.

7. A cavity resonator as defined in claim 6 further characterized in that said dielectric element further includes a second slot for accepting a cavity tuning screw.

8. A cavity resonator as defined in claim 7 wherein said slots are located within the opposed major surfaces of said substantially planar element of dielectric material.

9. A cavity resonator as defined in claim 1 wherein said body includes apertures in opposed end walls for mounting optical lenses.

10. A cavity resonator as defined in claim 9 further including means for mounting a photodetector.

11. A $TE_{101}$ mode cavity resonator comprising in combination:
   (a) a body comprising a cap and a lower body and having a substantially rectangular internal cavity;
   (b) said body having a pair of apertures at opposed ends thereof for mounting optical lenses;
   (c) a substantially planar dielectric element within said cap; and
   (d) means for preferentially ordering electromagnetic energy with said cavity.

* * * * *